United States Patent
Frank et al.

(10) Patent No.: US 10,090,939 B2
(45) Date of Patent: Oct. 2, 2018

(54) INTEGRATED RF CIRCUIT WITH PHASE-NOISE TEST CAPABILITY

(71) Applicant: Infineon Technologies AG, Neubiberg (DE)

(72) Inventors: Oliver Frank, Linz (AT); Guenter Haider, Linz (AT); Jochen O. Schrattenecker, Reichenthal (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/685,542

(22) Filed: Aug. 24, 2017

(65) Prior Publication Data

US 2018/0062768 A1    Mar. 1, 2018

(30) Foreign Application Priority Data

Aug. 25, 2016 (DE) .................. 10 2016 115 785

(51) Int. Cl.
*H04B 17/00* (2015.01)
*H04B 17/14* (2015.01)
*H04B 15/00* (2006.01)

(52) U.S. Cl.
CPC ....... *H04B 17/0085* (2013.01); *H04B 15/005* (2013.01); *H04B 17/14* (2015.01)

(58) Field of Classification Search
CPC .... H04B 17/0085; H04B 17/14; H04B 17/19; H04B 15/005
See application file for complete search history.

(56) References Cited

U.S. PATENT DOCUMENTS

| 7,061,222 B2* | 6/2006 | Shank ................ G01R 27/32 324/520 |
|---|---|---|
| 9,331,797 B2 | 5/2016 | Kordik et al. |
| 2003/0020521 A1 | 1/2003 | Lee et al. |
| 2007/0026830 A1 | 2/2007 | Guilford |
| 2008/0258707 A1* | 10/2008 | Dunsmore ............ G01R 27/32 324/76.23 |
| 2011/0273197 A1* | 11/2011 | Banerjee ............ G01R 31/2843 324/750.3 |

(Continued)

FOREIGN PATENT DOCUMENTS

| DE | 10 2015 115 017 A1 | 3/2016 |
| EP | 1 584 929 A2 | 10/2005 |
| JP | S63-038329 A | 2/1988 |

(Continued)

*Primary Examiner* — Tuan Pham
(74) *Attorney, Agent, or Firm* — Volpe and Koenig, P.C.

(57) ABSTRACT

An integrated circuit is described herein. According to one or more embodiments, the integrated circuit includes a local oscillator with a voltage-controlled oscillator (VCO) that generates a local oscillator signal. Further, the integrated circuit includes a frequency divider coupled to the VCO downstream thereof. The frequency divider provides a frequency-divided local oscillator signal by reducing the frequency of the local oscillator signal by a constant factor. A first test pad of the integrated circuit is configured to receive a reference oscillator signal. Further, the integrated circuit includes a first mixer that receives the reference oscillator signal and the frequency-divided local oscillator signal to down-convert the frequency-divided local oscillator signal.

24 Claims, 7 Drawing Sheets

(56) References Cited

U.S. PATENT DOCUMENTS

2016/0087734 A1  3/2016  Kordik et al.

FOREIGN PATENT DOCUMENTS

| JP | S63-050068 U | 2/1988 |
| JP | 6-24779 Y2 | 6/1994 |
| JP | H06 281722 A | 10/1994 |
| JP | 2002 521904 A | 7/2002 |
| JP | 2012 083310 A | 4/2012 |
| JP | 3213331 U | 11/2017 |

* cited by examiner

INTEGRATED RF CIRCUIT WITH PHASE-NOISE TEST CAPABILITY

FIELD

The present disclosure relates to radio frequency (RF) circuits. Some embodiments relate to an RF chip including "design for test" (DFT) features that may allow for improved automatic testing of an on-chip RF oscillator.

BACKGROUND

Radio frequency (RF) transceivers and receivers can be found in numerous applications, particularly in the field of wireless communications and radar sensors. In the automotive sector, there is an increasing demand for radar sensors used in so-called "adaptive cruise control" (ACC) or "radar cruise control" (RCC) systems. Such systems may be used, for example, to automatically adjust the speed of an automobile so as to maintain a safe distance from other automobiles or other objects ahead.

Modern radar systems make use of highly integrated RF circuits, which may incorporate all core functions of an RF font-end of a radar transceiver in one single chip package (single chip transceiver). Such RF front-ends may include, inter alia, a voltage controlled oscillator (VCO), amplifiers such as power amplifiers, low noise amplifiers (LNAs), mixers, filters. One or more analog-to-digital converters (ADC) may also be included to provide a digital output. Furthermore, the chip or the chip package may include one or more antennas. Radio frequency chips such as the semiconductor chips including the RF front-end of a radar sensor are also referred to as monolithic microwave integrated circuits (MMICs).

Radar applications used in automobiles are subject to various standards concerning road traffic safety, for example the functional safety standard ISO 26262 titled "Road vehicles—Functional safety". To ensure the functional safety of a radar sensor, it is important to know whether the current state of the radar sensor allows a reliable distance and speed measurement. However, also in applications different from radar, reliability may be an issue.

In radar systems the overall noise floor limits the sensitivity, with which radar targets can be detected. In this regard it is noted that the phase noise properties of the on-chip oscillators may have a significant impact on the overall noise floor and thus on the sensitivity and accuracy of the distance and velocity measurement. To ensure that the on-chip RF oscillator operates within the desired specifications, the RF chips (MMICs), which include the RF oscillators, may be subject to various automatic tests including tests characterizing the noise properties of the on-chip RF oscillator. For an economic production the duration of these automatic tests and the number of chips that can be tested in parallel are important parameters.

SUMMARY

An integrated circuit is described herein. According to one embodiment, the integrated circuit includes a local oscillator with a voltage-controlled oscillator (VCO) that generates a local oscillator signal. Further, the integrated circuit includes a frequency divider coupled to the VCO downstream thereof. The frequency divider provides a frequency-divided local oscillator signal by reducing the frequency of the local oscillator signal by a constant factor. A first test pad of the integrated circuit is configured to receive a reference oscillator signal. Further, the integrated circuit includes a first mixer that receives the reference oscillator signal and the frequency-divided local oscillator signal to down-convert the frequency-divided local oscillator signal.

Moreover, a method for testing an RF oscillator, which is integrated in a monolithic microwave integrated circuit (MMIC), is described herein. According to one embodiment, the method comprises dividing, by a frequency divider integrated in the MMIC, the frequency of an RF oscillator signal, which is generated by the RF oscillator, to generate an RF signal with a reduced frequency. The method further includes down-converting, by a mixer integrated in the MMIC, the RF signal with a reduced frequency to generate a mixer output signal. The mixer uses a reference oscillator signal for the down-conversion which is generated by an external test equipment and supplied to the mixer via a first test pad of the MMIC. Finally, the method includes the processing of the mixer output signal.

Furthermore, a system is described herein, which includes an automatic test equipment for testing monolithic microwave integrated circuits (MMICs) and a MMIC to be tested. According to one embodiment, the ATE includes a reference oscillator that generates a reference oscillator signal. The MMIC includes an integrated RF circuit that comprises a local oscillator with a voltage-controlled oscillator (VCO) that generates a local oscillator signal. The integrated RF circuit further includes a frequency divider that is coupled to the VCO downstream thereof. The frequency divider provides a frequency-divided local oscillator signal by reducing the frequency of the local oscillator signal by a constant factor. The integrated RF circuit further includes a first test pad for receiving the reference oscillator signal from the ATE. A mixer, which is integrated in the MMIC, receives the reference oscillator signal via the first test pad and further receives the frequency-divided local oscillator signal to down-convert the frequency-divided local oscillator signal.

BRIEF DESCRIPTION OF THE DRAWINGS

The invention can be better understood with reference to the following drawings and descriptions. The components in the figures are not necessarily to scale; in-stead emphasis is placed upon illustrating the principles of the invention. More-over, in the figures, like reference numerals designate corresponding parts. In the drawings.

DETAILED DESCRIPTION

Embodiments of the present invention are discussed below in the context of a radar transceiver. It should be noted, however, that the present invention may also be applied in applications different from radar such as, for example, RF transceivers of RF communication devices. In fact, the herein described approach for testing the properties of an on-chip RF oscillator (usually referred to as "local oscillator" or simply LO) does not depend on the specific application of the system.

A so-called "single chip radar" may include circuitry providing the core RF functions needed for distance and/or velocity measurement in one chip. The silicon chips, which include the RF circuitry are usually referred to as monolithic microwave integrated circuits (MMICs). A radar MMIC may include, inter alia, RF front-end circuitry such as RF oscillators, amplifiers, and mixers, and base band (and/or intermediate frequency (IF) band) circuitry such as amplifiers and analog filters. Additionally, an analog-to-digital converter may be included in the chip to digitize the base-band or IF-band signal. In future sensor designs, also a digital signal processor may be included in the chip together with the ADC, the base-band circuitry and the RF frontend circuitry. However, in today's radar sensors, a signal processor is usually implemented in a separate chip.

Figure 1:
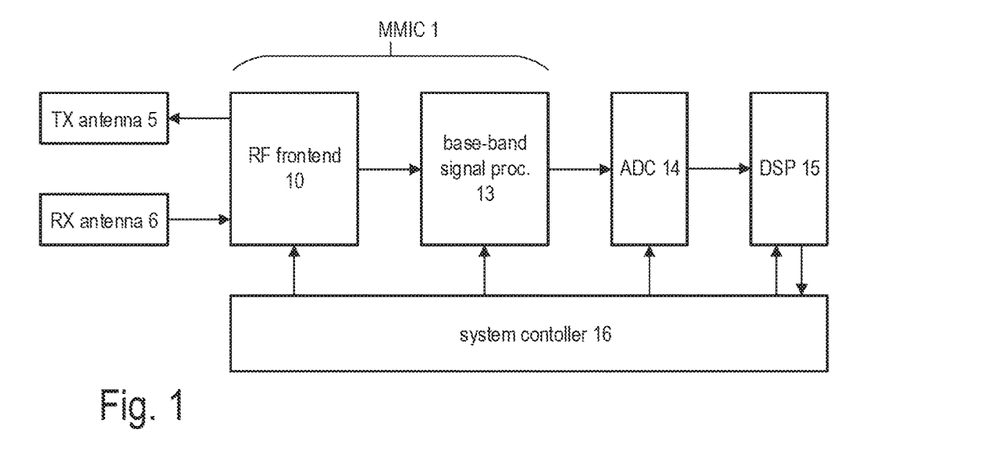
FIG. 1 is a block diagram illustrating one example structure of a radar sensor according to one or more embodiments.

FIG. 1 illustrates a block diagram that illustrates an example structure of a radar sensor. However, a similar structure may also be found in RF transceivers used in other applications such as communications systems. Accordingly, at least one transmit antenna 5 (TX antenna) and at least one receive antenna 6 (RX antenna) are connected to an RF frontend 10 included in a MMIC 1. The RF frontend 10 may include all the circuit components needed for RF signal processing. Such circuit components include, for example, a local oscillator (LO), RF power amplifiers, low noise amplifiers (LNAs), directional couplers such as rat-race-couplers and circulators, and mixers for the down-conversion of RF signals into the base-band or an IF-band or the up-conversion of base-band signals or IF-signals into the RF band. It is noted that antenna-arrays may be used instead of single antennas. The depicted example shows a bistatic (or pseudo-monostatic) radar system, which has separate RX and TX antennas. In case of a monostatic radar system, a single antenna or a single antenna array may be used for both, receiving and transmitting electromagnetic (radar) signals.

In this case a directions coupler (e.g. a circulator) may be used to separate RF signals to be transmitted to the radar channel from RF signals received from the radar channel.

In case of a frequency-modulated continuous-wave (FMCW) radar system, the transmitted RF signals radiated by the TX antenna 5 are in the range above approximately 20 GHz (e.g. 24 GHz) and 81 GHz (e.g. 77 GHz in automotive applications) and composed of so-called "chirps" (frequency ramps). The RF signals received by the RX antenna 6 includes the radar echoes, i.e. the signals back-scattered at the so-called radar targets. As mentioned, the received RF signals are down-converted into the base band and further processed in the base-band using analog signal processing (see FIG. 1, base-band signal processing chain 13), which basically includes filtering and amplification of the base-band signal. The base-band signal is finally digitized using one or more analog-to-digital converters 14 and further processed in the digital domain (see FIG. 1, digital signal processing chain implemented, e.g., in digital signal processor 15). The overalls system is controlled by a system controller 15, which may be at least partly implemented using a processor such as a microcontroller executing appropriate firmware. As indicated in FIG. 1 the RF frontend 10 and the analog base-band signal processing chain (and optionally the ADC 14) may be integrated in MMIC 1.

Figure 2:
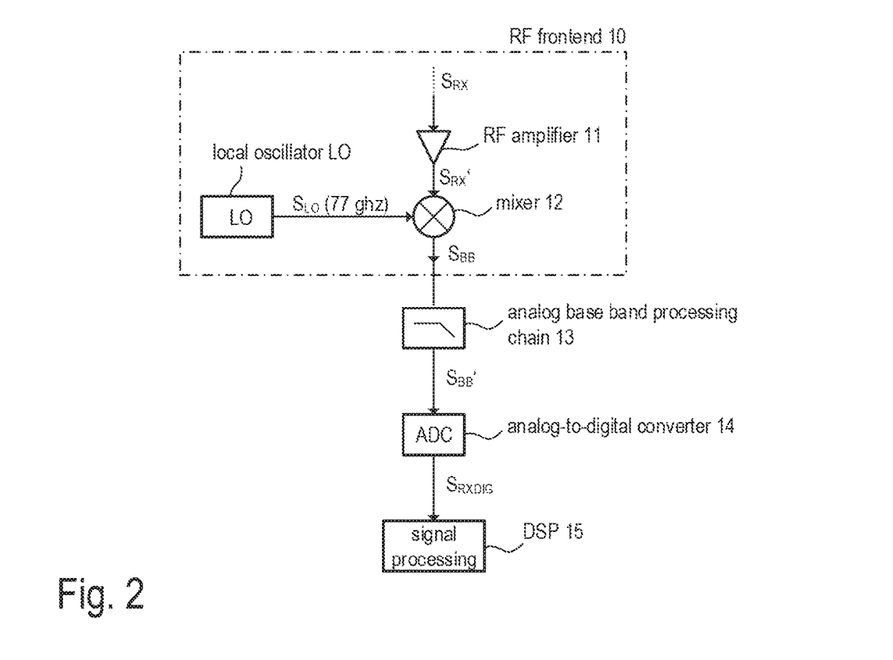
FIG. 2 is a circuit diagram illustrating the basic structure of a receive channel of an RF transceiver or receiver according to one or more embodiments.

FIG. 2 illustrates the receive path (receive channel) of an RF receive channel as included, for example, in a radar distance measurement device. In accordance with the present example, the receive channel includes a mixer 12, which is supplied with an RF input signal $S_{RX}$ and an RF oscillator signal $S_{LO}$ (mixer reference signal), which is used to down-convert the RF input signal $S_{RX}$ into the base band or an IF-band. The RF input signal $S_{RX}$ may be provided by an antenna (cf. FIG. 1, RX antenna 6) and may be pre-amplified before being supplied to the mixer 12. In the present example, the amplified RF input signal (signal $S_{RX}'$) is provided by the RF amplifier 11, and the RF oscillator signal $S_{LO}$ is generated by a local oscillator LO, which may include, for example, a voltage controlled oscillator (VCO) coupled in a phase locked loop (PLL). However, the RF oscillator signal $S_{LO}$ may be provided by other circuitry dependent on the actual application. When used in a radar distance measurement device, the RF oscillator signal $S_{LO}$ may be in the range between approximately 20 GHz and 81 GHz (usually approximately 77 GHz). However, higher or lower frequencies may also be applicable. In case of a so-called frequency-modulated continuous-wave (FMCW) radar sensor, the RF oscillator signal $S_{LO}$ is usually frequency-modulated. The operating principle of an FMCW radar is, however, as such known and thus not further discussed herein. The mixer 12 and all circuit components arranged upstream to the mixer 12 may be regarded as parts of the RF frontend 10. In the present example, the down-conversion is accomplished in one step by one mixer 12. Alternatively, down-conversion may also be accomplished in two or more steps using two or more mixers connected in series.

One or more antennas and, as mentioned above, digital signal processor cores may be included in the same chip package as the RF front-end (RF circuitry and mixers) and the base-band signal-processing chain. As practically the whole radar distance measurement system is integrated in a single chip-package, the system is also referred to as system-in-a-package (SiP). However, the ADC and the digital part of the system (that is usually manufactured using CMOS technology) may also be arranged in one or more separate chips. Similarly, the antenna may be arranged in a separate package. In some embodiments, so-called Embedded Wafer Level Ball Grid Array (eWLB) packages are used for packaging the RF and base-band circuitry as well as the antenna(s).

As mentioned, the mixer 12 down-converts the RF input signal $S_{RX}'$ (amplified antenna signal) into the base band. The respective base band signal (mixer output signal) is denoted by $S_{BB}$. The down-conversion may be accomplished in a single stage (i.e. from the RF band into the base band) or via one or more intermediate stages (from the RF band into an IF band and subsequently into the base band). The base band signal $S_{BB}$ is then subject to analog base band signals processing provided, for example, by the signal processing chain 13. The signal processing chain 13 include at least one analog filter to suppress undesired sidebands or image frequencies. The signal processing chain 13 may include at least one of the following components: a low-pass filter, a high pass filter, and a base band amplifier. The filtered base band signal (output signal of the signal processing chain 13) is denoted by $S_{BB}'$. Receivers which make use of a mixer to down-convert the RF input signal into the base band are as such known as homodyne receivers and thus not further discussed in more detail. The filtered base band signal $S_{BB}'$ is then sampled and converted to a digital signal $S_{RXDIG}$ (analog-to-digital converter 14), which is then further processed in the digital domain using, for example, a signal processor 15. In case of a down-conversion into an IF band instead of the base band, the IF signal may also be processed in the same manner as the base band signal in the present example and subsequently digitized for a digital demodulation of the IF signal and further digital processing. The digital signal processing may be performed using, e.g., a digital signal processor (DSP) executing appropriate software instructions. For this purpose, one or more processor cores may be integrated in the same chip as analog signal processing chain 13. However, in present implementations the digital signal processors are usually provided in separate semiconductor chips.

FIG. 2 illustrates the receive path of an RF receiver or transceiver. In so-called bistatic or pseudo-monostatic radar systems, the receiver may be separate from the transmitter as receiver and transmitter use separate antennas. However, receive paths having a similar structure as shown in FIG. 1 can also be found in a monostatic radar system, in which the same antenna is used to transmit and receive RF signals and the present explanations also apply to monostatic radar systems.

Figure 3:
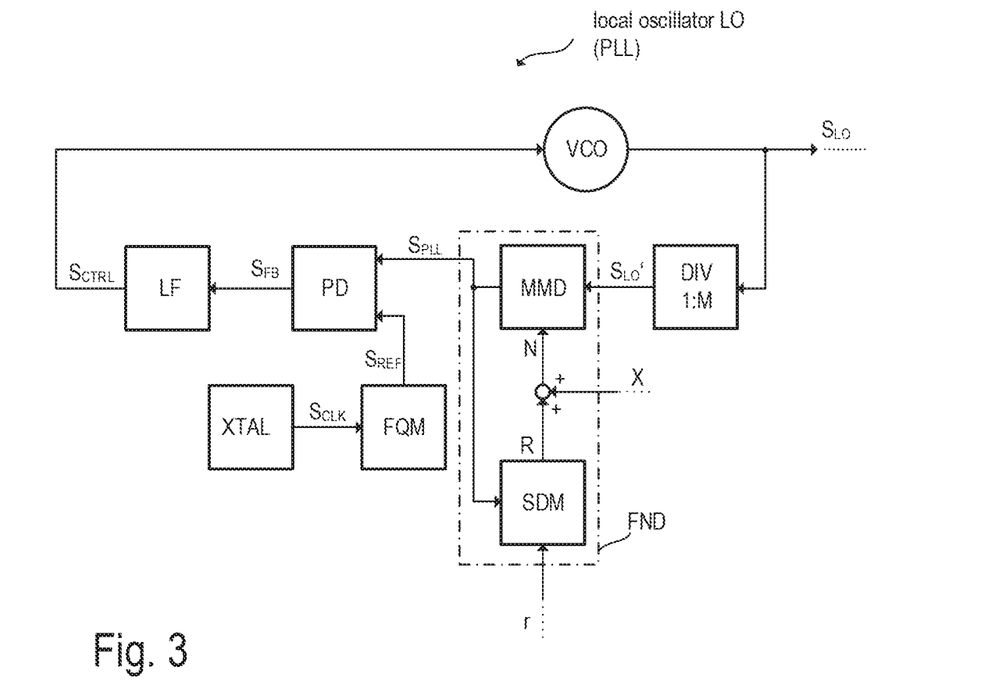
FIG. 3 is a block diagram illustrating one example implementation of an RF oscillator (local oscillator) which includes a PLL for adjusting the oscillation frequency according to one or more embodiments.

FIG. 3 illustrates one example implementation of an RF oscillator, which is composed of a voltage controlled oscillator VCO coupled in a phase locked loop (PLL). Such an RF oscillator may be used as local oscillator LO in an RF transceiver or receiver, for example as illustrated in FIG. 2.

According to the example shown in FIG. 3, the local oscillator LO includes a PLL with a fractional-N multi-modulus frequency divider. Such a fractional-N multi-modulus frequency dividers composed of a multi-modulus divider MMD and a Σ-Δ modulator SDM, which is configured to continuously alter the (integer) frequency division modulus so as to accomplish a rational number as effective frequency division modulus.

The PLL includes a voltage controlled oscillator VCO which generates an oscillating output signal $S_{LO}$ having an frequency denoted as $f_{LO}$, which is set in accordance with a control input of the oscillator VCO (oscillator control signal $S_{CTRL}$). The oscillating output signal $S_{LO}$ may be pre-divided using a frequency divider DIV that applies a constant division ratio M. In one specific example, the division ratio M may be 32 so that an oscillator frequency $f_{LO}$ of approximately 80 GHz is transformed to a pre-divided oscillator frequency $f_{LO}'$ of approximately 2.5 GHz (pre-divided oscillator signal $S_{LO}'$). The signal $S_{LO}'$ may then be supplied to the multi-modulus frequency divider MMD, which has a selectable (integer) division ratio N. That is, the frequency divider MMD is configured to divide the frequency supplied to its input and to generate a divider output signal $S_{PLL}$ having a frequency denoted as $f_{PLL}$, wherein $f_{LO}'=N \cdot f_{PLL}$ and $f_{LO}=N \cdot M \cdot f_{PLL}$. The division ratio N is selectable dependent on a signal supplied to a select input of the frequency divider MMD. The output signal $S_{PLL}$ (frequency $f_{PLL}$) of the frequency divider MMD is also referred to as PLL clock signal. In a radar application the RF oscillator frequency $f_{LO}$ may be between 76 GHz and 81 GHz, while the PLL clock signal $S_{PLL}$ may have a PLL clock frequency $f_{PLL}$ in a range from 160 MHz to 200 MHz. Instead of using the pre-divider DIV, the oscillator signal $S_{LO}$ may be directly supplied to the multi-modulus divider MMD, i.e. the pre-division of the oscillator frequency $f_{LO}$ may be omitted.

The frequency divider output signal $S_{PLL}$ as well as a reference signal $S_{REF}$, which has a frequency $f_{REF}$, are supplied to a phase detector PD (also known as phase comparator). Dependent on the implementation a phase-frequency-detector PFD may be employed instead. Phase detectors as well as phase-frequency detectors are commonly used in the field of PLLs and therefore not further discussed in more detail.

In the present example, the reference signal $S_{REF}$ may be provided by a frequency multiplier FQM, which is configured to multiply the frequency $f_{CLK}$ (also referred to as system clock frequency) of a reference oscillator XTAL, which usually is (but not necessarily has to be) a crystal oscillator. That is, the frequency $f_{REF}$ may be (indirectly) determined by the resonance frequency of a quartz crystal oscillator. Alternatively, the reference signal $S_{REF}$ may directly be provided by the reference oscillator XTAL without any frequency multiplication. The reference frequency $f_{REF}$ may be, for example, in a range between 160 MHZ and 200 MHz, while the system clock frequency $f_{CLK}$ provided by the reference oscillator XTAL is, for example, in the range from 40 MHz to 80 MHz. In the present examples, the frequency multiplier FQM uses a multiplication factor between 2 and 5. However different multiplication factors and frequency values for $f_{CLK}$, $f_{PLL}$, and $f_{LO}$ may be used, dependent on the application.

The output signal $S_{CTRL}$ of the phase (-frequency) detector P(F)D is usually generated by a charge-pump included in the output stage of the phase detector. The output signal $S_{CTRL}$ may be regarded as an error signal that is filtered by a loop filter LF, which determines the band-width of the control loop. The charge pump usually drives a current signal to the loop filter. The output signal of the loop filter LF is used as control signal $S_{CTRL}$ to adjust the oscillator frequency $f_{LO}$ of the oscillator VCO, thus closing the control loop. The closed loop ensures that the frequency $f_{LO}$ is continuously tuned to such a value that the phases of the divider output signal $S_{PLL}$ and the reference signal $S_{REF}$ match. That is, the phase is "locked". Various implementations of phase (-frequency) detector P(F)D including charge-pumps are as such known in the art and thus not further discussed herein in more detail.

Generally, the division ratio N used by the frequency divider MMD is an integer number. To accomplish a non-integer division ratio, the integer ratio N may be modulated by a Σ-Δ modulator SDM such that the average (and effective) division ratio is a rational number. The Σ-Δ modulator SDM may be clocked by the PLL clock signal $S_{PLL}$ (clock frequency $f_{PLL}$) and is supplied with a (e.g. digital) input value r which represents a rational number (e.g. between 0 and 1 or between 0 and 2). The values R generated at the output of the Σ-Δ modulator SDM are integer values, which have an average value equal to the input value r. An integer offset value X may be added to the modulator output signal R (N=X+R). The sum value N equals—on average—X+r, and is then supplied to the select input of the divider MMD, which sets the division ratio in accordance to the sum value N. That is, the divider MMD receives an updated division ratio N each clock cycle of $S_{PLL}$ in accordance with the modulator output. Due to the Σ-Δ modulation the average division ratio is X+r, i.e. an integer ratio X augmented by a fractional value r. Alternatively, the integer offset may be already included in the input value r. In this case, r is not a fraction between 0 and 1 but rather a rational number within a specific interval (e.g. the interval [2, 8]). Usually Σ-Δ modulators are used which have a 3rd order MASH (multi stage noise shaping) structure, also referred to as MASH3 modulator.

By appropriately tuning the (effectively rational) division ratio N used by the frequency divider MMD, a frequency modulation of the RF oscillator signal $S_{LO}$ may be accomplished. In radar applications, frequency modulation is particularly used to generate so-called chirp signals (also known as sweep signals). A chirp signal, or simply a chirp, is a signal, in which the frequency increases ("up-chirp") or decreases ("down-chirp") over time. Chirp signals are commonly used in sonar and radar applications, but also in other applications, such as in spread spectrum communications. In practice the frequency variation may be linear (linear chirp, frequency ramp), exponential (exponential chirp) or hyperbolic (hyperbolic chirp). One efficient way to generate a frequency modulated RF oscillator signal $S_{LO}$ is to appropriately vary the (rational) division ratio X+r of the fractional-N frequency divider.

As can be seen in FIG. 2 the oscillator signal $S_{LO}$ is also used as mixer reference signal, which is used by the mixer to down-convert the received RF signal $S_{RX}'$ into the base band. In addition to the desired signal (i.e. the desired chirp signal), the local oscillator signal $S_{LO}$ includes noise, in particular amplitude and phase noise, wherein phase noise is more problematic as it may deteriorate the sensitivity and accuracy of the radar distance and velocity measurements. As the local oscillator signal $S_{LO}$ is used by the mixer, the phase noise is directly converted into the base band and is thus also included in the base band signal $S_{BB}$ as well as in the digital signal $S_{RXDIG}$ (see FIG. 2).

In signal processing, phase noise is the frequency domain representation of rapid, short-term, random fluctuations in the phase of a waveform, caused by time domain instabilities, which is sometimes referred to as "jitter". As mentioned above, phase noise is a significant quality parameter and it may be important to know the amount of phase noise generated by the local oscillator LO. For example, in some applications like automotive radar sensors each single MMIC is tested to check during an automatic test (end-of-line test) whether the phase noise is within the specified limits.

Figure 4:
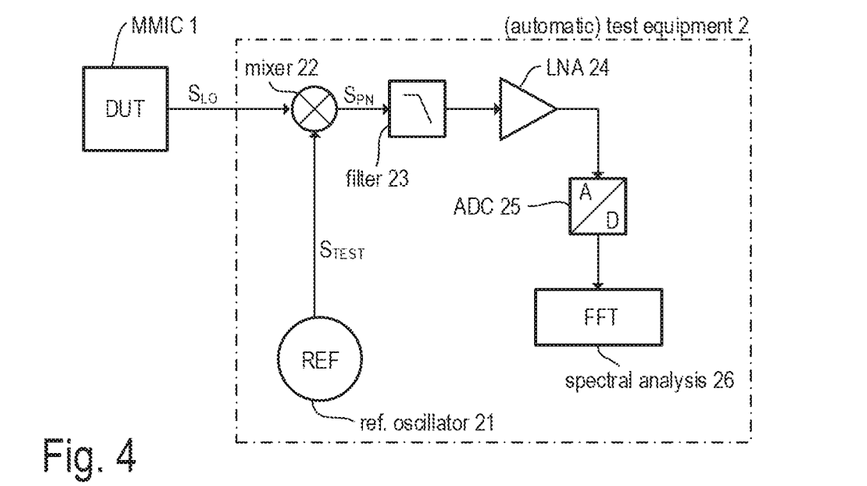
FIG. 4 is a block diagram illustrating a test set-up, which can be used to characterize the phase noise properties of an RF oscillator; the test set-up uses the so-called reference oscillator technique to obtain the spectrum of the phase noise or specific parameters of the spectrum according to one or more embodiments.

FIG. 4 illustrates, based on a block diagram, one technique for measuring the phase noise generated by an RF oscillator such as, for example the local oscillator LO integrated in a MMIC of a radar sensor (cf. FIG. 2). The circuit components forming the test circuit shown in FIG. 2 may be included in an automatic test equipment (ATE) 2 that may be used to test MMICs during an end-of-line test. The test circuit includes a low-noise RF reference oscillator 21, which generates very low noise power as compared with the local oscillator LO included in the device under test (DUT), i.e. the MMIC 1. Thus, the technique for analyzing the phase noise is also referred to as reference oscillator technique. Accordingly, the oscillator signal $S_{LO}$ generated by the DUT is fed into the RF input of a mixer 22, while the low-noise reference oscillator signal $S_{TEST}$ is supplied to the reference input of the mixer 22 to down-convert the oscillator signal $S_{LO}$ into the base-band. The resulting base-band signal at the mixer output is denoted as $S_{PN}$. The signal $S_{PN}$, which may be filtered (filter 23) to remove undesired image frequencies and amplified by a low-noise amplifier (LNA) 24, essentially incudes the phase noise included in the oscillator signal $S_{LO}$. The filtered and amplified signal $S_{PN}'$ is then digitized by an ADC 25 and further processed in the digital domain, e.g. using a digital signal processor 26 or the CPU of a personal computer and appropriate software. Usually, the desired information is based on the power spectral density (PSD) of the phase noise, which may be calculated, for example, using the well-known Fast-Fourier-Transform (FFT) algorithm.

ATE systems, which can be used for testing integrated oscillators in accordance with the reference oscillator technique, are available on the market. One example is the UltraFLEX Test System of Teradyne. However those systems are rather expensive and only a small number of MMICs can be tested simultaneously, basically due to the limited number of mixers provided by the ATE systems. Furthermore, low-noise reference oscillators operating in the same frequency range as the on-chip local oscillator (i.e. the range of 76 to 81 GHz in case of radar applications) are not available in standard ATEs. However, reference oscillators which operate at frequencies up to approximately 6 GHz are readily available.

Figure 5:
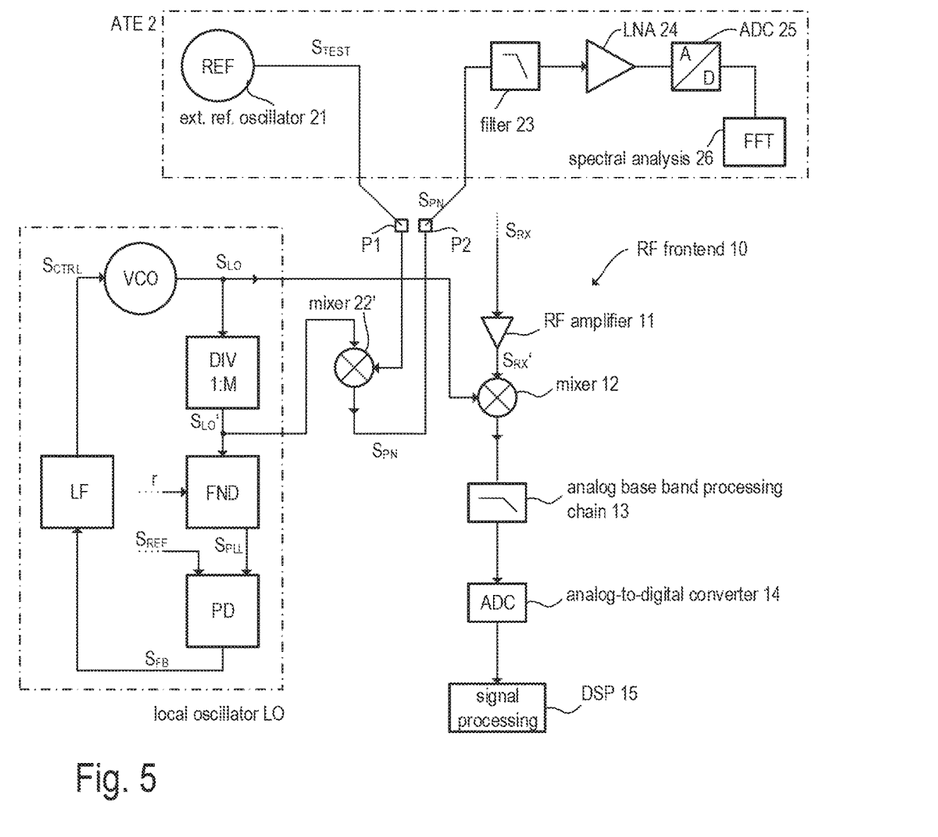
FIG. 5 is a block diagram illustrating a first example embodiment of a monolithic microwave integrated circuit (MMIC) which is capable of receiving an external reference oscillator signal for testing noise characteristics of the internal RF oscillator according to one or more embodiments.

FIG. 5 illustrates one embodiment of the receive path of an RF transceiver (or receiver) including the RF frontend 10 (local oscillator LO, RF amplifier 11, mixer 12, analog base band processing chain 13), the analog-to digital-converter 15, and the digital signal processor 15 as shown in the example of FIG. 2. The local oscillator includes a PLL as illustrated, for example, in FIG. 3. In this regard reference is made to FIGS. 2 and 3 to avoid repeating explanations. A compared to the example of FIG. 2 the RF frontend 10, which is integrated in the MMIC 1, includes an additional mixer 22'. The RF input of the mixer 22' is coupled to the PLL of the local oscillator LO, so that the frequency-divided oscillator signal $S_{LO}'$ is supplied to the RF input of the mixer 22'. The reference input of the mixer 22' is coupled to a test-pad P1 or test pin, at which a low-noise reference oscillator signal $S_{TEST}$ may be injected. The low-noise reference oscillator 21 may be part of an ATE 2. The output of the mixer 22' is also coupled to a further test-pad P2 or a further test-pin, at which the down-converted noise signal $S_{PN}$ can be tapped. In the example of FIG. 5, the down-converted noise signal $S_{PN}$ is further processed in the ATE 2, wherein the signal $S_{PN}$ is filtered (filter 23), amplified (LNA 24) and digitized (analog-to-digital converter 25). The resulting digital signal is further processed (see FIG. 5, spectral analysis implemented in digital signal processor 26) in the digital domain as explained above with reference to FIG. 4. In essence, the power spectral density (PSD) of the phase noise included in signal $S_{PN}$ or related signal parameters may be calculated using a digital signal processor such as the CPU of a personal computer or the like. In the present example, the mentioned parameters are the PSD of the signal $S_{PN}$ provided at test pad/pin P2 for one or more specific frequency values (e.g. 100 kHz, 300 kHz, and 1000 kHz). Subsequently, the ATE 2 may check whether or not the mentioned signal parameters (e.g. PSD values at specific frequencies) comply with a given specification or not. The result of this check is a pass/fail decision, which can be used to mark the respective MMIC as rejected or to separate the respective MMIC out.

Integrating the additional mixer 22' into the RF frontend 10 of the MMIC 1 allows end-of-line testing of the MMICs with less complex ATE systems. Furthermore, the number of MMICs which can be tested simultaneously is significantly increased and basically only limited by the number of ADC channels available in the ATE system.

It is noted, that the phase noise measurement/analysis is not based on the local oscillator signal $S_{LO}$, which is provided at the output of the voltage-controlled oscillator VCO, but rather based on the frequency-divided oscillator signal $S_{LO}'$ provided at the output of the frequency divider DIV, which is coupled to the voltage-controlled oscillator VCO downstream thereof. As mentioned above, the frequency divider DIV has a fixed division ratio M that does not change during the measurement. A fixed division ratio does not necessarily mean that the division ratio is hard-wired. The fixed division ration may be configurable but, however, does not change during the test measurement. Dependent on the actual implementation, there may be two or more frequency dividers connected in series instead of the single frequency divider DIV. The signal $S_{LO}'$ supplied to the RF input of mixer 22' may be tapped at the output of any frequency divider in the PLL downstream of the voltage-controlled oscillator VCO but, however, upstream of the fractional-N divider FND.

As an illustrative example a division ratio M=32 is assumed for the frequency divider DIV. Further assuming a local oscillator frequency $f_{LO}$ of 76.8 GHz (80 GHz), the frequency of the frequency-divided local oscillator signal $S_{LO}'$ is 2.4 GHz (2.5 GHz). Thus the frequency range from 76.8 GHz to 80 GHz is mapped to the frequency range from 2.4 GHz to 2.5 GHz. Due to the pre-division of the local oscillator signal $S_{LO}$ by a factor M, the frequency of the reference oscillator signal $S_{TEST}$ can be much lower as in the example of FIG. 4, for example 2.5 GHz instead of 80 GHz. The ATE system needs only to provide a low-noise reference oscillator 21 generating a reference signal in the UHF band instead of the EHF (or SHF) band.

Figure 6:
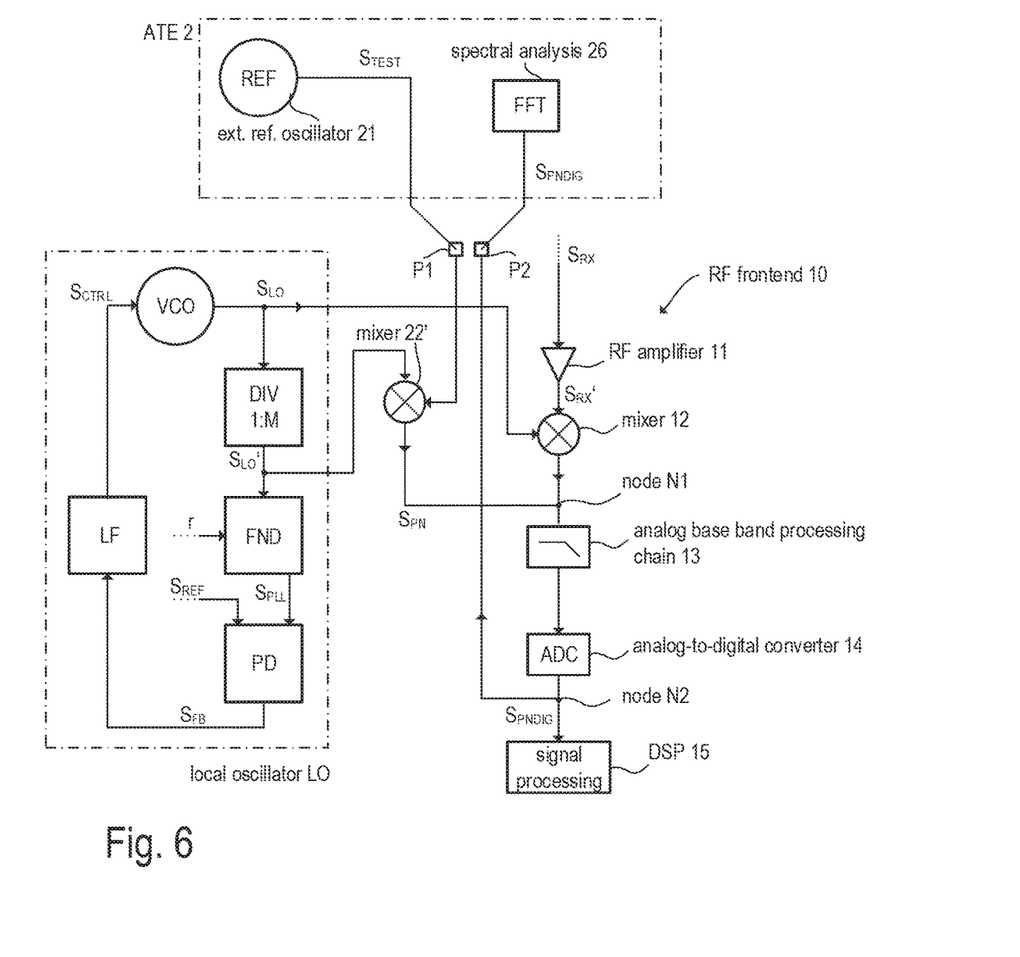
FIG. 6 is a block diagram illustrating a second example embodiment of a MMIC which is capable of receiving an external reference oscillator signal for testing noise characteristics of the internal RF oscillator according to one or more embodiments.

FIG. 6 illustrates an alternative embodiment of the receive path of an RF transceiver (or receiver) as shown in the example of FIG. 2. The local oscillator includes a PLL as illustrated, for example, in FIG. 3. Similar to the previous example of FIG. 5, an additional mixer 22' is included in the RF frontend 10. The RF input of the mixer 22' is coupled to the PLL of the local oscillator LO, so that the frequency-divided oscillator signal $S_{LO}'$ is supplied to the RF input of the mixer 22'. The reference input of the mixer 22' is coupled to the test-pad P1 or test pin, at which a low-noise reference oscillator signal $S_{TEST}$ may be injected. The output signal $S_{PN}$ is, however, not directed to the further test pad P2 (line in the embodiment of FIG. 5), but rather directed to circuit node N1, which is at the input of the base-band signal processing chain 13 arranged in the receive path, which is configured to process the received radar signal during normal operation of the radar sensor.

In the present example, the task of filtering and digitizing the down-converted oscillator signal $S_{PN}$ is accomplished by the integrated base-band signal processing chain 13 (including, e.g., a filter and an amplifier) and the integrated analog-to-digital converter 14. The resulting digital signal $S_{PNDIG}$ (available at circuit node N2) is then directed to the test pad P2, where it may be tapped by the ATE 2. The ATE 2 incudes a digital signal processor for processing the digital signal in the digital domain as explained in the previous example of FIG. 5. The digital signal $S_{PNDIG}$ may be directed to the ATE 2 using Low Voltage Differential Signaling (LVDS). Therefore, the test pad P2 may be composed of two parts to allow differential signaling to the ATE 2. Except the processing of the output signal $S_{PN}$ of the additional mixer 22', the embodiment of FIG. 6 is the same as the previous embodiment of FIG. 5 and reference is made to the above description.

Figure 7:
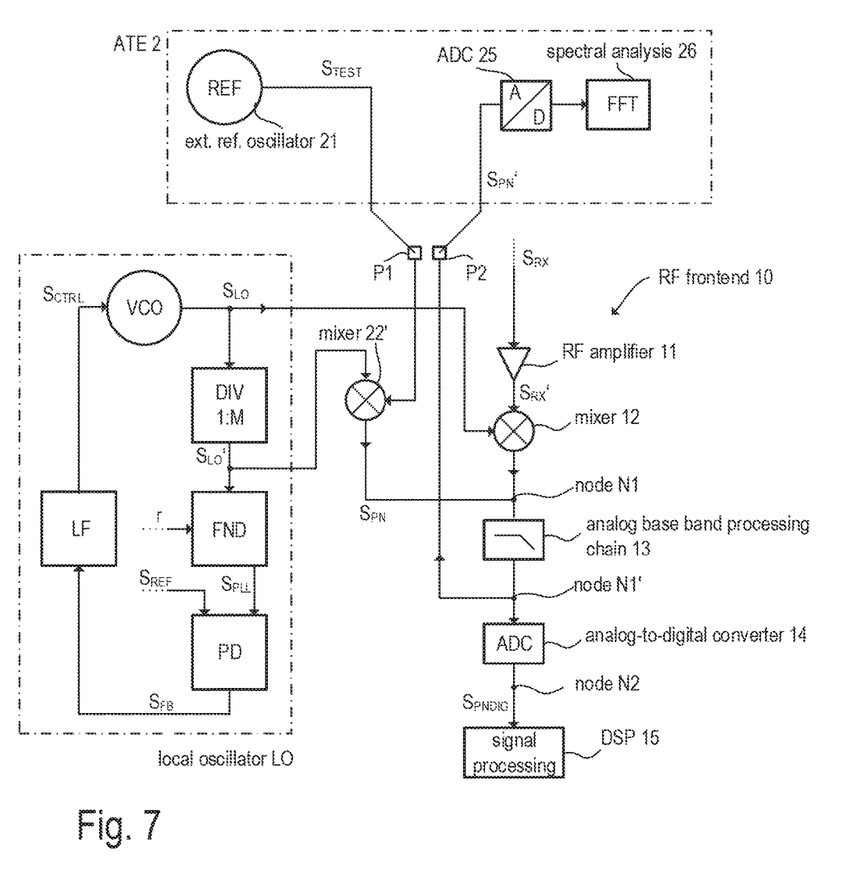
FIG. 7 is a block diagram illustrating a third example embodiment which is a slight modification of the example of FIG. 5 according to one or more embodiments.

FIG. 7 illustrated a further example embodiment which is a modification of the previous embodiment of FIG. 5. As compared to FIG. 5, the output signal $S_{PN}$ of mixer 22' is not directly directed to the further test pad P2 but rather pre-processed by the analog base-band signal processing chain 13 included in the MMIC 1. Accordingly, the output of mixer 22' is coupled to node N1 (input of the analog base-band signal processing chain 13) and the circuit node N1' (output of the analog base-band signal processing chain 13) is connected to the further test pad P2, at which the pre-processed mixer output signal $S_N'$ is provided. As compared to the example of FIG. 6, the ADC 25 of the ATE is used instead of the ADC 14, which is available on-chip.

Figure 8:
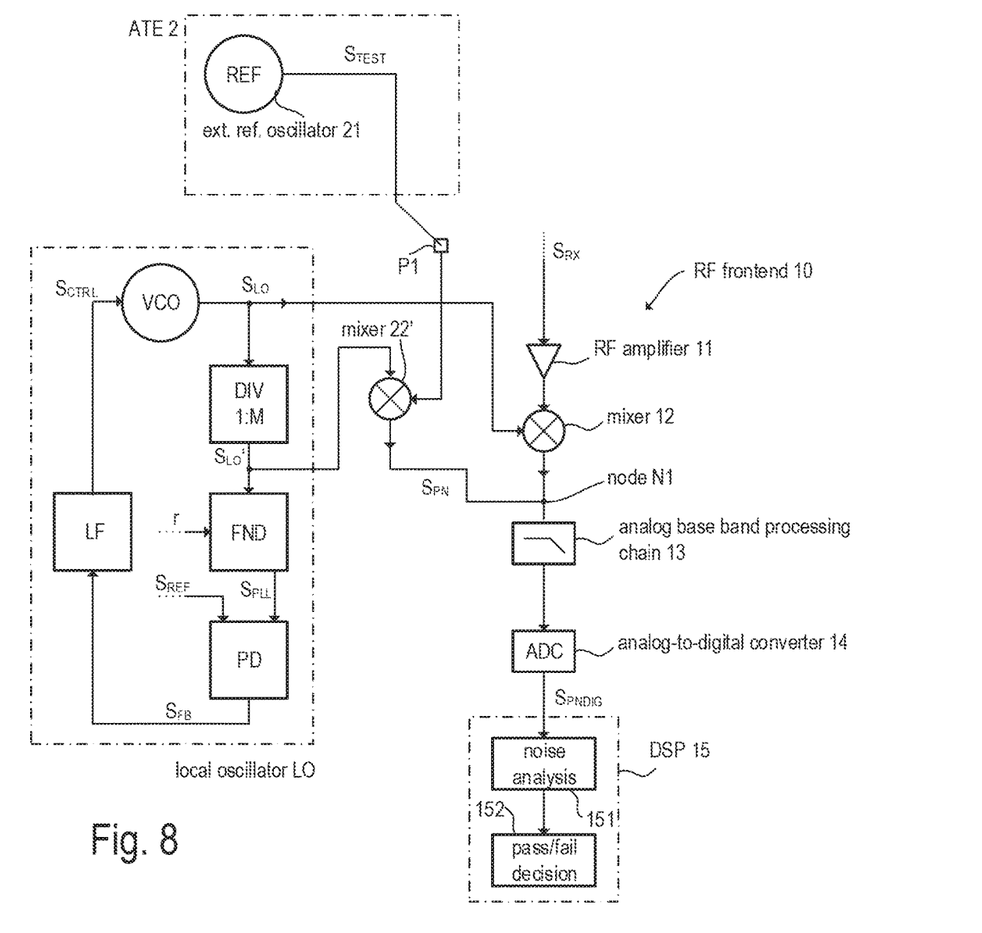
FIG. 8 is a block diagram illustrating a fourth example embodiment of a MMIC which is capable of receiving an external reference oscillator signal for testing noise characteristics of the internal RF oscillator, wherein the noise characteristics are determined on-chip according to one or more embodiments.

FIG. 8 illustrates an alternative to the previous embodiment of FIG. 6. The embodiment of FIG. 8 is essentially identical to the embodiment of FIG. 6 except that the digital signal processing is accomplished by the DSP 15 of the radar device instead of a DSP integrated in the ATE 2. Therefore, the ATE 2 basically needs only to provide the reference oscillator signal $S_{TEST}$. As compared to the previous embodiment of FIG. 6, the test pad P2 and the signal connection between test pad P2 and circuit node N2 may be omitted. The DSP 15 is configured to process the digital signal $S_{PNDIG}$ in the same manner as the processor of the ATE (see FIG. 6, block 25) in the previous example of FIG. 6. Accordingly, a functional block 151 may be implemented in the DSP 15 (e.g. using appropriate software), which is configured to calculate the power of the digital signal $S_{PNDIG}$ at one or more frequency values (e.g. the power spectral density, PSD). The signal power is essentially dominated by phase noise of the local oscillator LO. A further functional block 152 may be included in the DSP 15, which is configured to check whether the calculated power values comply with specified maximum values. The result of such a check may be "passed" (noise power compliant with specification) or "failed" (noise power not compliant with specification). The ATE may receive the test results from the DSP 15 in the form of Boolean information (test passed/failed).

It should be noted that various aspects of the embodiments illustrated in FIGS. 5 to 8 may be combined to obtain further embodiments. For example, more than two test-pads P1 and P2 may be provided to provide various options to connect an ATE. For example, the embodiment of FIG. 7 may be supplemented with an additional test pad, which is connected directly to the output of mixer 22' (cf. FIG. 5), and/or with a further test pad connected to the output of the ADC 14 (circuit node N2) to provide a digital signal to the ATE (cf. FIG. 6).

Figure 9:
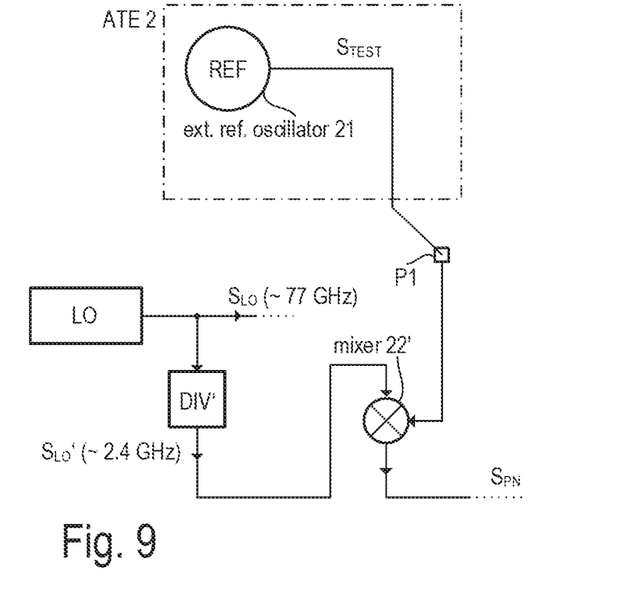
FIG. 9 is a block diagram of a general embodiment of a MMIC which is capable of receiving an external reference oscillator signal for testing the internal RF oscillator according to one or more embodiments.

FIG. 9 illustrates a general example of a MMIC that is capable of receiving an external reference oscillator signal $S_{TEST}$ for testing the internal RF oscillator. The term "internal" is used to indicate that the respective circuit component is integrated in the MMIC, whereas the term "external" is used to indicate that the respective circuit component is implemented separately from the MMIC to be tested. External and internal signals are distinguished analogously. Accordingly, the external reference oscillator signal $S_{TEST}$ is generated by an external signal source (e.g. ATE 2) and supplied to the MMIC via a chip pad (test pad/pin) P1. On the chip, the chip pad P1 is connected to the reference input of an mixer 22', which is integrated in the MMIC. The local oscillator LO generates a local oscillator signal $S_{LO}$, which may have (for radar applications) an oscillation frequency $f_{LO}$ in the EHF or SHF band. The frequency divider DIV' is coupled to the local oscillator LO and configured to generate (based on the local oscillator signal $S_{LO}$) an oscillator signal $S_{LO}'$ that has a reduced frequency $f_{LO}'$ (e.g. reduced by an integer factor), which may be, for example, in the UHF band. The frequency divider output signal $S_{LO}'$ has the same or similar noise characteristic as the local oscillator signal $S_{LO}$ (i.e. the noise characteristic is preserved by the frequency division) and thus the frequency divider output signal $S_{LO}'$ is further processed (i.e. down-converted by mixer 22', digitized, etc., see also FIGS. 5-8) to measure the desired noise parameters (e.g. power spectral density at specific frequencies in the base band) as discussed above.

It should be mentioned that the frequency divider is not coupled in the PLL feedback loop included in the local oscillator LO but rather connected separately to the local oscillator output. However, the oscillator signal $S_{LO}'$ may also be tapped at a frequency divider (with fixed division ratio) that is included in the feedback loop as shown in the example of FIGS. 5-8. In the example of FIG. 9, the mixer output may be processed on-chip (see FIG. 8) or in an external ATE (see FIGS. 5-7) as explained above.

Figure 10:
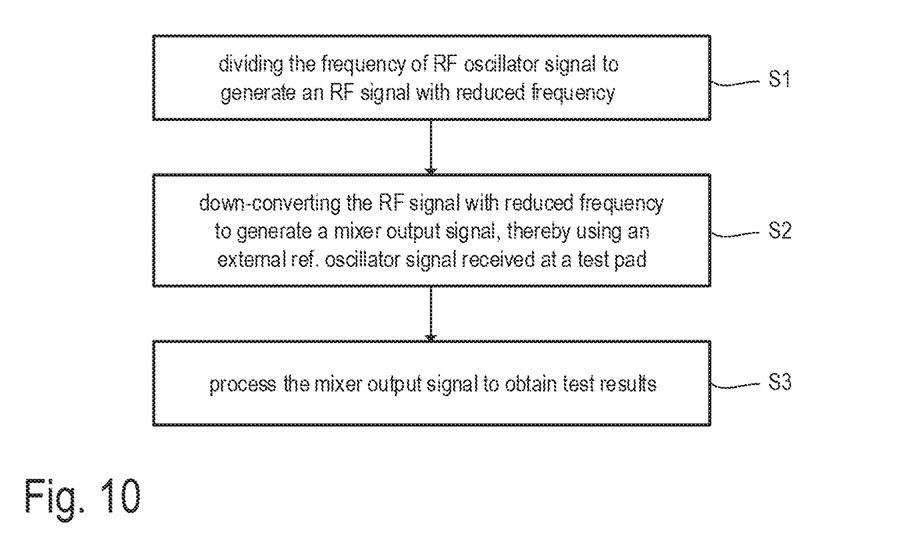
FIG. 10 is a flow chart illustrating one example method for testing an RF oscillator integrated in a MMIC.

FIG. 10 is a flow chart illustrating one example method for testing an RF oscillator integrated in a MMIC. Accordingly, the frequency of an (internal) RF local oscillator signal (see, e.g., FIGS. 5-9, signal $S_{LO}$) is divided by a fixed division ratio (see FIG. 10, step S1) to generate an RF signal with reduced frequency (see, e.g., FIGS. 5-9, signal $S_{LO}'$). As mentioned the frequency divider may be included in a PLL feedback-loop of the local oscillator (see, e.g., FIGS. 5-8, frequency divider DIV) or connected separately to the local oscillator (see, e.g., FIG. 9, frequency divider DIV'). The RF signal with reduced frequency is down-converted to generate a mixer output signal (see FIG. 10, step S2), thereby using an external reference oscillator signal received at a test pad of the MMIC (see FIGS. 5-9, signal $S_{TEST}$ at pad P1 supplied to mixer 22'). The mixer output signal (see FIGS. 5-9, signal $S_{PN}$) is processed (e.g. as discussed with respect to the examples shown in FIGS. 5-8) to obtain the desired test results.

Although embodiments have been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond— unless otherwise indicated—to any component or structure, which performs the specified function of the described component (e.g., that is functionally equivalent), even though not structurally equivalent to the disclosed structure, which performs the function in the herein illustrated example implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An integrated circuit comprising:
    a local oscillator including a voltage-controlled oscillator (VCO) that generates a local oscillator signal;
    a frequency divider coupled to the VCO downstream thereof, the frequency divider providing a frequency-divided local oscillator signal by reducing the frequency of the local oscillator signal by a constant factor;
    a first test pad for receiving a reference oscillator signal; and
    a first mixer receiving the reference oscillator signal and the frequency-divided local oscillator signal to down-convert the frequency-divided local oscillator signal.

2. The integrated circuit of claim 1, further comprising:
    a second mixer configured to be coupled with an antenna and receiving the local oscillator signal; and
    a base-band signal processing chain connected to the second mixer downstream thereof.

3. The integrated circuit of claim 2, further comprising:
    an analog-to-digital converter coupled to the base-band signal processing chain downstream thereof.

4. The integrated circuit of claim 3, further comprising:
    a digital signal processor (DSP) coupled to the analog-to-digital converter downstream thereof.

5. The integrated circuit of claim 1, further comprising:
    a second test pad connected to an output of the first mixer.

6. The integrated circuit of claim 3, wherein:
    an output of the first mixer is coupled to an input of the base-band signal processing chain to direct the down-converted frequency-divided local oscillator signal to the base-band signal processing chain.

7. The integrated circuit of claim 6, further comprising:
    a second test pad coupled to an output of the base-band signal processing chain.

8. The integrated circuit of claim 6, further comprising:
    a second test pad coupled to a digital output of the analog-to-digital converter.

9. The integrated circuit of claim 8, wherein:
    a signal connection between the digital output of the analog-to-digital converter and the second test pad is a low-voltage differential signaling (LVDS) connection.

10. The integrated circuit of claim 6, further comprising:
    an analog-to-digital converter coupled to the base-band signal processing chain downstream thereof, the analog-to-digital converter generating a digital signal representing the down-converted frequency-divided local oscillator signal; and
    a digital signal processor (DSP) coupled to the analog-to-digital converter downstream thereof,
    wherein the DSP is configured to perform a spectral analysis of the digital signal.

11. A method for testing a radio frequency (RF) oscillator, which is integrated in a monolithic microwave integrated circuit (MMIC), the method comprising:

dividing, by a frequency divider integrated in the MMIC, the frequency of an RF oscillator signal, which is generated by the RF oscillator, to generate an RF signal with a reduced frequency;

down-converting, by a mixer integrated in the MMIC, the RF signal with a reduced frequency to generate a mixer output signal, wherein the mixer uses a reference oscillator signal for the down-conversion which is generated by an external test equipment and supplied to the mixer via a first test pad of the MMIC; and processing the mixer output signal.

12. The method according to claim 11, wherein processing the mixer output signal comprises:

analog preprocessing of the mixer output signal;

digitizing of the preprocessed mixer output signal to provide a digital signal; and performing spectral analysis of the digital signal.

13. The method according to claim 12, wherein:

analog preprocessing of the mixer output signal is accomplished at least partially by automatic test equipment (ATE); or analog preprocessing of the mixer output signal is accomplished at least partially by an analog signal processing chain integrated in the MMIC.

14. The method according to claim 13, wherein:

the analog preprocessing comprises at least low-pass filtering or band-pass filtering.

15. The method according to claim 13, wherein:

digitizing of the preprocessed mixer output signal is accomplished at least partially by the ATE; or digitizing of the preprocessed mixer output signal is accomplished at least partially by an analog-to digital-converter integrated in the MMIC.

16. The method according to claim 12, wherein performing spectral analysis of the digital signal comprises:

calculating at least one digital power value representing a power-spectral-density of the digital signal for at least one discrete frequency value; and checking whether the at least one digital power value complies with a predefined specification.

17. The method according to claim 12, wherein the spectral analysis of the digital signal is performed by a digital signal processor integrated in the MMIC.

18. The method according to claim 13, wherein the spectral analysis of the digital signal is performed by a digital signal processor included in the ATE.

19. A system comprising, an automatic test equipment (ATE) configure to test monolithic microwave integrated circuits (MMICs), the ATE comprising a reference oscillator that generates a reference oscillator signal; and an MMIC including an integrated radio frequency (RF) circuit that comprises:

a local oscillator including a voltage-controlled oscillator (VCO) that generates a local oscillator signal;

a frequency divider coupled to the VCO downstream thereof, the frequency divider providing a frequency-divided local oscillator signal by reducing the frequency of the local oscillator signal by a constant factor;

a first test pad for receiving the reference oscillator signal from the ATE; and a mixer receiving the reference oscillator signal via the first test pad and the frequency-divided local oscillator signal to down-convert the frequency-divided local oscillator signal.

20. The system according to claim 19, wherein:

the integrated RF circuit further comprises a second test pad that receives a signal representing an output of the mixer; and the ATE is configured to receive, via the second test pad, the signal representing the output of the mixer.

21. The system according to claim 20, wherein:

the ATE includes a signal processor configured to perform a spectral analysis of the signal representing the output of the mixer.

22. The system according to claim 21, wherein:

prior to the spectral analysis of the signal representing the output of the mixer, the signal representing the output of the mixer is digitized or subject to analog preprocessing and digitized by the ATE.

23. The system according to claim 19, wherein:

the frequency divider and the VCO are included in a feedback loop of a phase-locked loop (PLL).

24. The system according to claim 19, wherein:

the integrated RF circuit includes a radar transceiver for a radar distance measurement sensor, the radar transceiver receiving the local oscillator signal generated by the VCO.

* * * * *